United States Patent
Lee et al.

(10) Patent No.: US 10,912,215 B2
(45) Date of Patent: Feb. 2, 2021

(54) DISPLAY DEVICE

(71) Applicant: SAMSUNG DISPLAY CO., LTD., Yongin-si (KR)

(72) Inventors: Seung-Jun Lee, Hwaseong-si (KR); Myung Ho Lee, Anyang-si (KR); Myoung Seop Song, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/400,583

(22) Filed: May 1, 2019

(65) Prior Publication Data
US 2020/0068733 A1 Feb. 27, 2020

(30) Foreign Application Priority Data
Aug. 21, 2018 (KR) .................. 10-2018-0097451

(51) Int. Cl.
| | |
|---|---|
| *H05K 1/14* | (2006.01) |
| *H05K 1/18* | (2006.01) |
| *H01L 23/498* | (2006.01) |
| *H05K 5/02* | (2006.01) |
| *H05K 5/00* | (2006.01) |

(52) U.S. Cl.
CPC ........... *H05K 5/0247* (2013.01); *H05K 1/147* (2013.01); *H05K 1/189* (2013.01); *H05K 5/0017* (2013.01); *H01L 23/4985* (2013.01); *H05K 2201/10128* (2013.01)

(58) Field of Classification Search
CPC ..... H05K 5/0247; H05K 1/147; H05K 5/0017
See application file for complete search history.

(56) References Cited

U.S. PATENT DOCUMENTS

| | | | |
|---|---|---|---|
| 6,945,789 B2 * | 9/2005 | Kuwaharada ....... | G02F 1/13452 349/150 |
| 8,638,326 B2 * | 1/2014 | Ko ....................... | G09G 3/3225 345/212 |
| 8,836,675 B2 * | 9/2014 | Takenaka ............ | G02F 1/13452 345/204 |
| 9,615,477 B2 * | 4/2017 | Ling ..................... | H05K 3/361 |
| 10,159,145 B2 * | 12/2018 | Nakaminami ........... | H05K 1/18 |
| 10,163,391 B2 * | 12/2018 | Jeong ................... | G09G 3/3233 |
| 2008/0129717 A1 * | 6/2008 | Lee ...................... | G09G 3/3677 345/204 |

(Continued)

FOREIGN PATENT DOCUMENTS

| | | |
|---|---|---|
| KR | 1020130112570 | 10/2013 |
| KR | 1020140072438 | 6/2014 |

(Continued)

*Primary Examiner* — Nathan Milakovich
(74) *Attorney, Agent, or Firm* — F. Chau & Associates, LLC

(57) ABSTRACT

A display device includes a display panel including a plurality of pixels, a second driving circuit that applies a gate signal to the plurality of pixels, and a first connecting member connected to the display panel on a first edge of the display panel. The first connecting member includes a control signal wiring connected to the second driving circuit. The display device further includes a flexible printed circuit board (FPCB) connected to the display panel on a second edge of the display panel. The second edge faces the first edge, and the FPCB includes a first driving circuit that applies a data voltage to the plurality of pixels.

18 Claims, 13 Drawing Sheets

(56) References Cited

U.S. PATENT DOCUMENTS

| | | | | |
|---|---|---|---|---|
| 2009/0073100 | A1* | 3/2009 | Kim | G02F 1/13452 345/92 |
| 2009/0206334 | A1* | 8/2009 | Yoon | G09G 3/006 257/48 |
| 2010/0073354 | A1* | 3/2010 | Kim | G09G 3/3674 345/213 |
| 2012/0212401 | A1* | 8/2012 | Bae | G09G 3/3648 345/88 |
| 2014/0139413 | A1* | 5/2014 | Kwon | G09G 3/3208 345/82 |
| 2019/0369423 | A1* | 12/2019 | Kim | G02F 1/13471 |

FOREIGN PATENT DOCUMENTS

| | | |
|---|---|---|
| KR | 1020140141276 | 12/2014 |
| KR | 1020150039254 | 4/2015 |
| KR | 1020170105683 | 9/2017 |

\* cited by examiner

DISPLAY DEVICE

CROSS-REFERENCE TO RELATED APPLICATIONS

This application claims priority under 35 U.S.C. § 119 to Korean Patent Application No. 10-2018-0097451 filed in the Korean Intellectual Property Office on Aug. 21, 2018, the disclosure of which is incorporated by reference herein in its entirety.

TECHNICAL FIELD

Embodiments of the present invention relates to a display device. More particularly, the present invention relates to a display device including a connection structure of a signal controller and a gate driver.

DISCUSSION OF THE RELATED ART

Recently, display devices have increased in size, and efforts have been made to minimize a peripheral area that includes dead space in which an image is not displayed. A display device typically includes at least one printed circuit board (PCB) on which circuits that drive a display panel of the display device are mounted. The design of the display device may be determined according to a connection structure of the display panel and the PCB.

A gate driver generating a gate signal for driving the display panel is operated by receiving a plurality of control signals and voltages from a signal controller. In some display devices, the signal controller is mounted on the PCB, and the gate driver is not mounted on the PCB. Accordingly, in such display devices, a structure for electrically connecting the signal controller and the gate driver is required. The structure for electrically connecting the signal controller and the gate driver should satisfy the design requirements of the display device while also minimizing the dead space of the display device.

SUMMARY

According to an exemplary embodiment of the present invention, a display device includes a display panel, a connecting member, a first printed circuit board (PCB), a first flexible printed circuit board (FPCB), a second PCB, a second driving circuit, and a third PCB. The display panel includes a plurality of pixels. The connecting member is connected to the display panel on a first edge of the display panel. The first PCB is electrically connected to the display panel through the connecting member. The first FPCB is connected to the display panel on a second edge of the display panel. The first FPCB includes a first driving circuit that applies a data voltage to the plurality of pixels. The second PCB is electrically connected to the display panel through the first FPCB. The second driving circuit is disposed on a third edge of the display panel. The second driving circuit applies a gate signal to the plurality of pixels. The third PCB is electrically connected to the first PCB and the second PCB. The third PCB includes a signal controller that controls the first driving circuit and the second driving circuit. The signal controller applies a gate control signal that controls an output of the gate signal to the first edge of the display panel through the first PCB and the connecting member such that the gate signal is transmitted to the second driving circuit.

In an exemplary embodiment, the second edge of the display panel faces the first edge of the display panel, and a display area including the plurality of pixels is disposed between the second edge and the first edge.

In an exemplary embodiment, the signal controller transmits a data control signal that controls the first driving circuit to the first driving circuit through the second PCB.

In an exemplary embodiment, the third PCB further includes a power supply that provides a power source voltage to the plurality of pixels, and the power supply provides the power source voltage to the plurality of pixels through the first PCB and the connecting member.

In an exemplary embodiment, the connecting member includes a first sub-connecting member and a second sub-connecting member. The second sub-connecting member is disposed further from the third edge of the display panel than the first sub-connecting member. The gate control signal is transmitted to the second driving circuit through the first sub-connecting member, and the power source voltage is transmitted to the plurality of pixels through the second sub-connecting member.

In an exemplary embodiment, the first sub-connecting member includes a first line region in which a control signal wiring that transmits the gate control signal is disposed, and a second line region in which a power source line that transmits the power source voltage is disposed. The first line region is disposed closer to the third edge of the display panel than the second line region.

In an exemplary embodiment, the display device further includes a second FPCB connected to the display panel on the third edge of the display panel and including the second driving circuit.

In an exemplary embodiment, the display panel includes a display area in which the plurality of pixels is disposed and a peripheral area surrounding the display area, and the second driving circuit is disposed in the peripheral area of the display panel.

According to an exemplary embodiment of the present invention, a display device includes a display area including a plurality of pixels, a power supply, a data driver, a gate driver, and a signal controller. The power supply applies a power source voltage to a first edge of the display area. The data driver applies a data voltage to a second edge of the display area. The second edge faces the first edge and the display area is disposed between the second edge and the first edge. The gate driver is disposed on a third edge of the display area, and applies a gate signal to the display area. The signal controller applies a gate control signal that controls the gate driver to the first edge of the display area. When viewing a screen on which an image is displayed in the display area, the first edge is an upper edge of the screen, the second edge is a lower edge of the screen, and the third edge is a right edge of the screen or a left edge of the screen.

In an exemplary embodiment, the signal controller transmits the gate control signal to the gate driver through a dummy connecting member, and the power supply transmits the power source voltage to the plurality of pixels through a first connecting member disposed adjacent to the dummy connecting member. The dummy connecting member is disposed closer to the third edge of the display area than the first connecting member.

In an exemplary embodiment, the signal controller transmits the gate control signal to the gate driver through a first sub-connecting member, and the power supply transmits the power source voltage to the plurality of pixels through the first sub-connecting member and a second sub-connecting member disposed adjacent to the first sub-connecting member. The first sub-connecting member is disposed closer to the third edge of the display area than the second sub-connecting member.

In an exemplary embodiment, the display device further includes a flexible printed circuit board (FPCB) disposed in a peripheral area adjacent to the third edge of the display area. The gate driver is mounted on the FPCB.

In an exemplary embodiment, the gate driver is disposed along the display area in a peripheral area adjacent to the third edge of the display area.

In an exemplary embodiment, the display device further includes a flexible printed circuit board (FPCB) disposed in a peripheral area adjacent to the second edge of the display area. The data driver is mounted on the FPCB, and the power supply applies the power source voltage to the second edge of the display area through the FPCB.

According to an exemplary embodiment of the present invention, a display device includes a display panel including a plurality of pixels, a second driving circuit that applies a gate signal to the plurality of pixels, and a first connecting member connected to the display panel on a first edge of the display panel. The first connecting member includes a control signal wiring connected to the second driving circuit. The display device further includes a flexible printed circuit board (FPCB) connected to the display panel on a second edge of the display panel. The second edge faces the first edge, and the FPCB includes a first driving circuit that applies a data voltage to the plurality of pixels.

In an exemplary embodiment, the first connecting member further includes a power source line that transmits a power source voltage for emission of the plurality of pixels.

In an exemplary embodiment, the display device further includes a signal controller that controls the first driving circuit and the second driving circuit. The control signal wiring is connected to the signal controller through the first connecting member.

In an exemplary embodiment, the display device further includes a first printed circuit board (PCB) electrically connected to the display panel through the first connecting member, and a second PCB electrically connected to the display panel through the FPCB. The signal controller is disposed on the second PCB.

In an exemplary embodiment, the display device further includes a third PCB electrically connected to the first PCB and the second PCB. The third PCB includes a power supply that provides a power source voltage to the plurality of pixels. The control signal wiring is connected to the signal controller through the first connecting member, the first PCB, and the third PCB.

In an exemplary embodiment, the display device further includes a second connecting member electrically connecting the first PCB and the second PCB. The control signal wiring is connected to the signal controller through the first connecting member, the first PCB, and the second connecting member.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
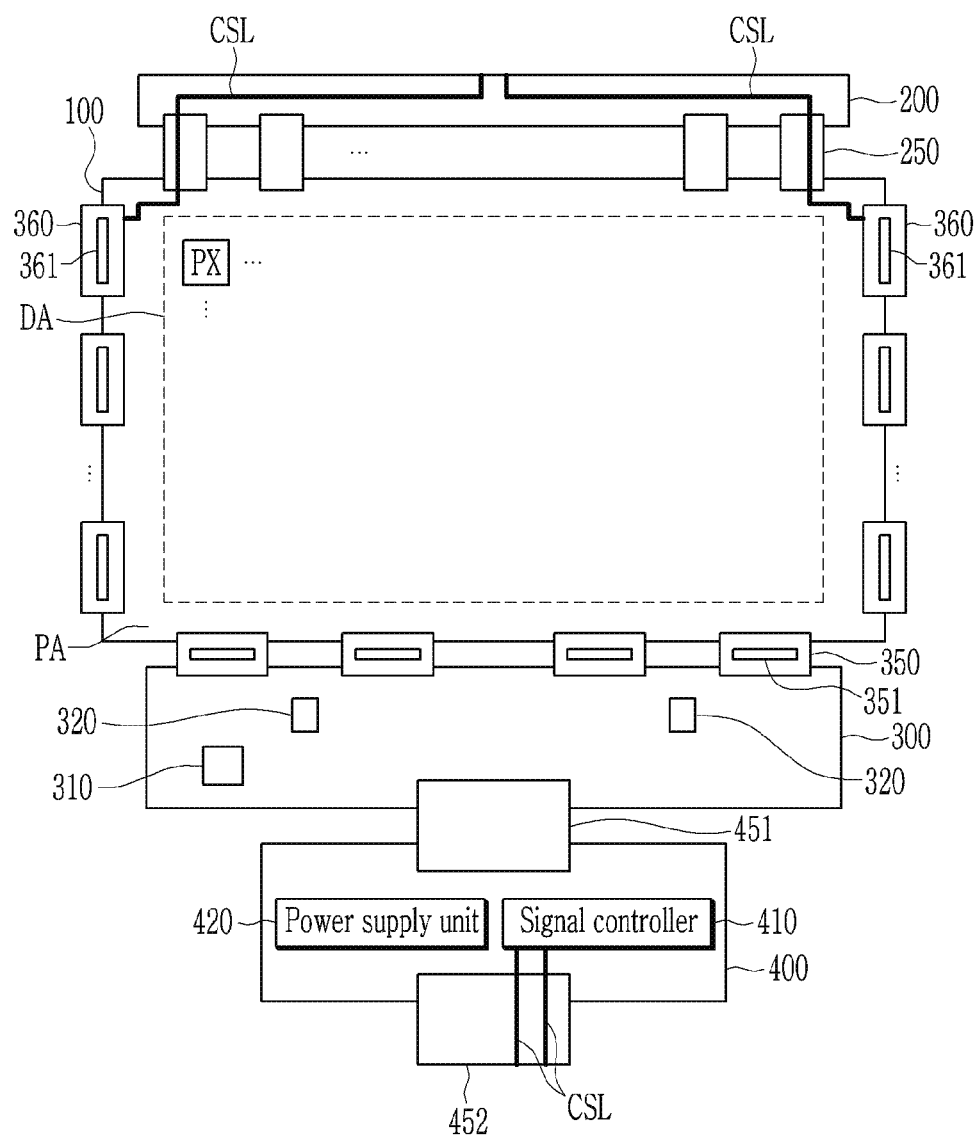
FIG. 1 is a top plan view of a front surface of a display device according to an exemplary embodiment of the present invention.

Exemplary embodiments of the present invention will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that descriptions of features or aspects within each exemplary embodiment should typically be considered as available for other similar features or aspects in other exemplary embodiments, unless the context clearly indicates otherwise.

It will be further understood that when a component, such as a film, a region, a layer, or an element, is referred to as being "on", "connected to", or "adjacent to" another component, it can be directly on, connected, or adjacent to the other component, or intervening components may be present.

Exemplary embodiments of the present invention provide a display device including an electrical connection structure of a signal controller and a gate driver capable of minimizing or reducing the dead space of the display device and satisfying the design requirements of the display device.

According to exemplary embodiments of the present invention, the dead space of the display device may be adjusted so as not to be increased by the electrical connection structure of the signal controller and the gate driver, and certain design requirements of the display device such as, for example, disposing the data driver on the lower side of the screen, may be satisfied.

A display device according to an exemplary embodiment of the present invention is described below with reference to FIGS. 1 to 6.

Figure 2:
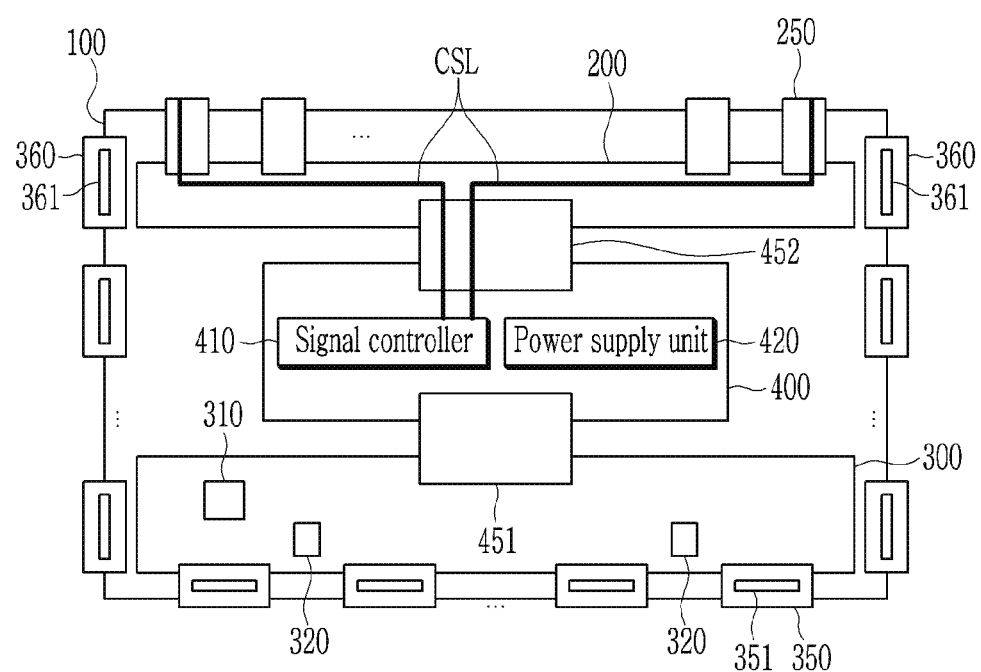
FIG. 2 is a top plan view of a rear surface of a display device according to an exemplary embodiment of the present invention.
Figure 3:
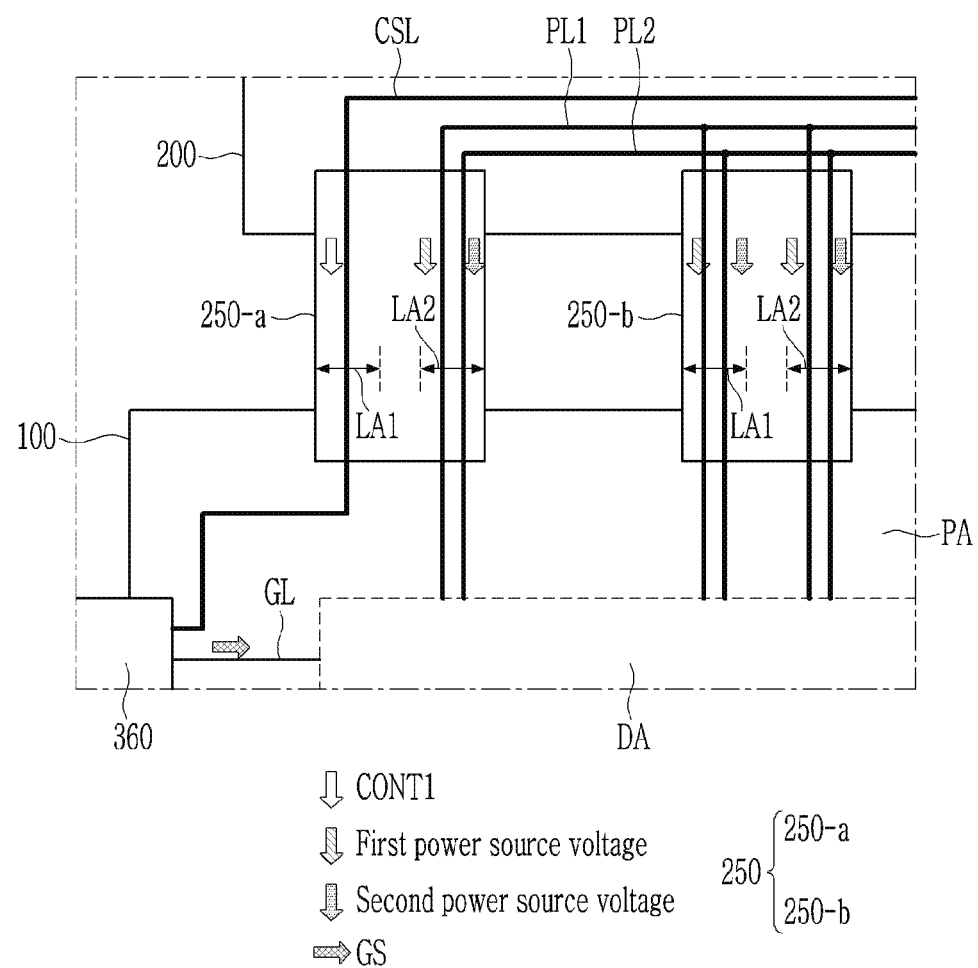
FIG. 3 is an enlarged view of a first connecting member part of the display device in FIG. 1.
Figure 4:
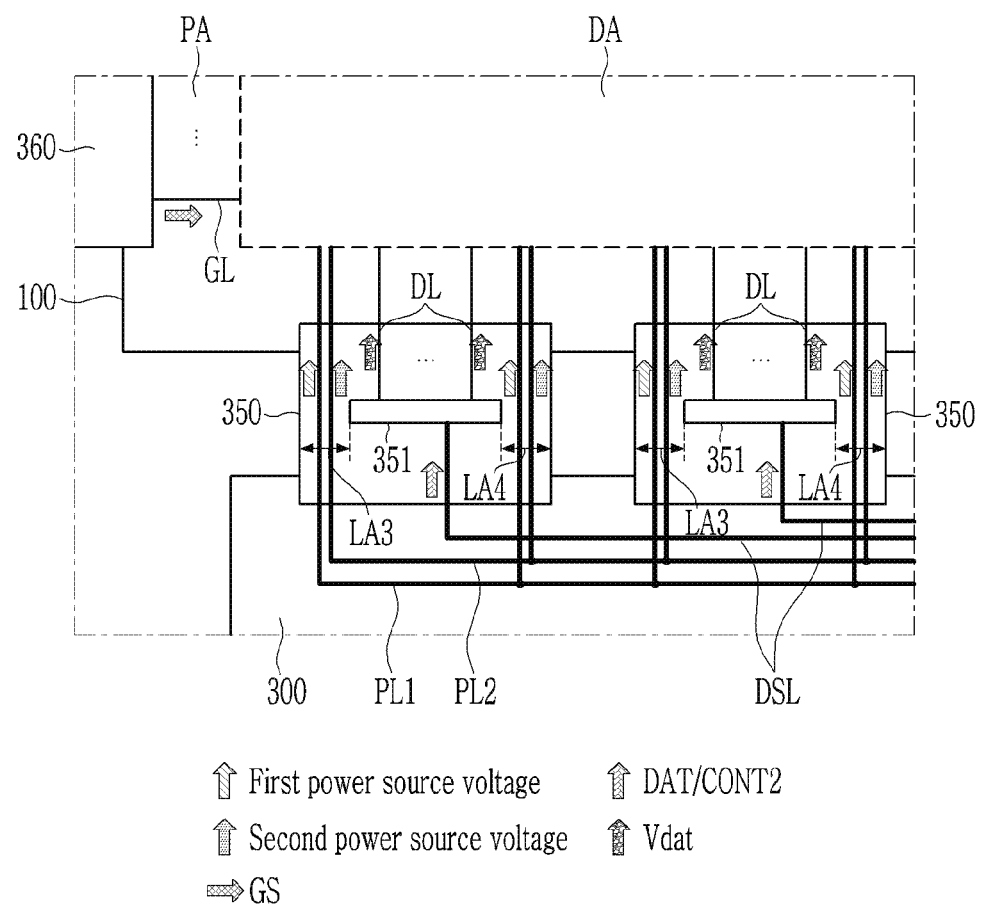
FIG. 4 is an enlarged view of a first flexible printed circuit board part of the display device in FIG. 1.
Figure 5:
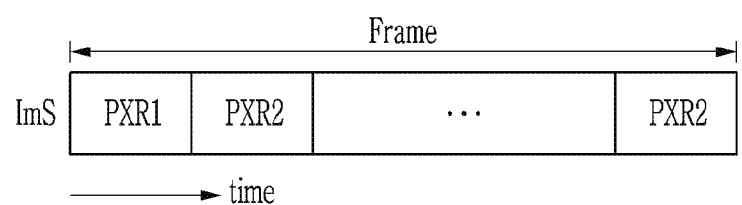
FIG. 5 is a view showing an example of an image signal input to a display device.
Figure 6:
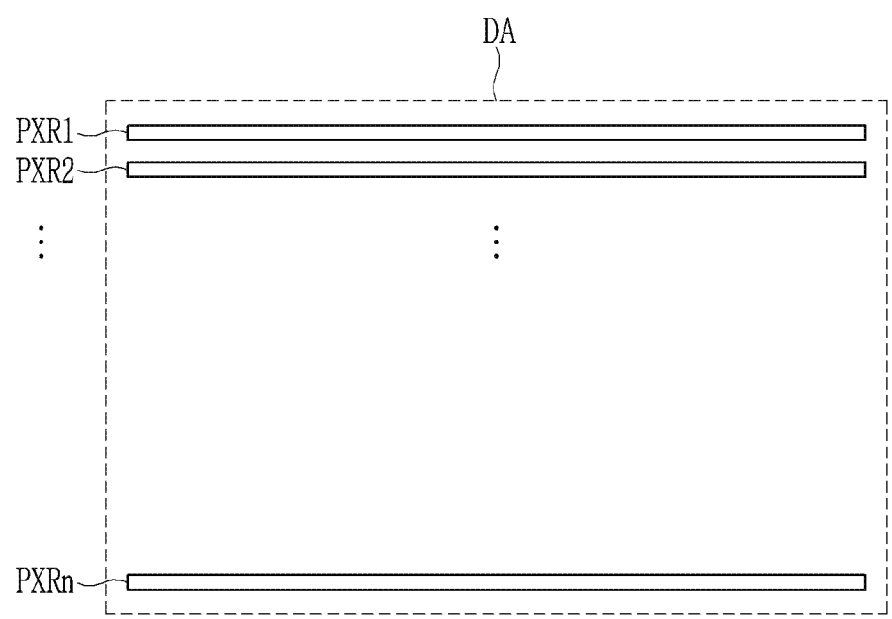
FIG. 6 is a view used to described a method of displaying an image corresponding to an image signal in a display area.

FIG. 1 is a top plan view of a front surface of a display device according to an exemplary embodiment of the present invention. FIG. 2 is a top plan view of a rear surface of a display device according to an exemplary embodiment of the present invention. FIG. 3 is an enlarged view of a first connecting member part of the display device in FIG. 1. FIG. 4 is an enlarged view of a first flexible printed circuit board (FPCB) part of the display device in FIG. 1. FIG. 5 is a view showing an example of an image signal input to a display device. FIG. 6 is a view used to describe a method of displaying an image corresponding to an image signal in a display area.

Referring to FIGS. 1 and 2, in an exemplary embodiment, a display device includes a display panel 100, a first printed circuit board (PCB) 200, a first connecting member 250, a second printed circuit board (PCB) 300, a first flexible printed circuit board (FPCB) 350, a second flexible printed circuit board (FPCB) 360, a third printed circuit board (PCB) 400, a second connecting member 451, and a third connecting member 452.

The display panel 100 includes a display area DA including a plurality of pixels PX, and a peripheral area PA surrounding the display area DA. The display area DA may include a plurality of gate lines (referring to GL of FIGS. 3 and 4) connected to the plurality of pixels PX, a plurality of data lines (referring to DL of FIG. 4), a plurality of voltage lines, etc.

A plurality of first connecting members 250 may be provided, and the plurality of first connecting members 250 may be connected to the display panel 100 on a first edge of the display panel 100. The first connecting member 250 may be electrically connected to the display panel 100 by an anisotropic conductive film (ACF) in the peripheral area PA. The first connecting member 250 may include a flexible circuit film or a wiring cable.

The first printed circuit board (PCB) 200 may be electrically connected to the first edge of the display panel 100 through the first connecting member 250. The first printed circuit board (PCB) 200 may be a substrate for transmitting a power source voltage for the driving of the plurality of pixels PX. The first printed circuit board (PCB) 200 may be electrically connected to the first connecting member 250 by the anisotropic conductive film (ACF). In an exemplary embodiment, the first printed circuit board (PCB) 200 is formed of one substrate. However, exemplary embodiments are not limited thereto. For example, according to an exemplary embodiment, a plurality of first printed circuit boards (PCB) 200 may be provided, and the plurality of first printed circuit boards (PCB) 200 may be electrically connected to the display panel 100 through different first connecting members 250.

The first edge of the display panel 100 may indicate a partial region of the peripheral area PA to which the first printed circuit board (PCB) 200 of the display panel 100 is electrically connected. The first edge of the display panel 100 may correspond to the first edge of the display area DA, and the first edge of the display area DA may indicate an upper edge of the screen when viewing the screen in which the image is displayed.

A plurality of first flexible printed circuit boards (FPCBs) 350 may be provided, and the plurality of first flexible printed circuit boards (FPCBs) 350 may be connected to the display panel 100 on a second edge of the display panel 100. Each of the plurality of first flexible printed circuit boards (FPCBs) 350 may include a first driving circuit unit 351. The first driving circuit unit 351 may be a data driver that applies a data voltage to the plurality of pixels PX. The first flexible printed circuit board (FPCB) 350 may be electrically connected to the display panel 100 by the anisotropic conductive film (ACF) in the peripheral area PA. The first flexible printed circuit board (FPCB) 350 may include a flexible circuit film, and the first driving circuit unit 351 may be mounted on the first flexible printed circuit board (FPCB) 350 as a chip on film (COF) type.

The second printed circuit board (PCB) 300 may include a memory 310 that stores information used for the operation of the display panel 100, and a temperature sensor 320 that measures a temperature near the second printed circuit board (PCB) 300. The memory 310 and the temperature sensor 320 may be mounted on the second printed circuit board (PCB) 300 as a chip on board (COB) type. FIG. 1 shows an example in which the memory 310 and the temperature sensor 320 are included in the second printed circuit board (PCB) 300. However, exemplary embodiments are not limited thereto. For example, in an exemplary embodiment, a plurality of chips or parts used for the operation of the display panel 100 may be mounted on the second printed circuit board (PCB) 300.

The second printed circuit board (PCB) 300 may be electrically connected to the second edge of the display panel 100 through the first flexible printed circuit board (FPCB) 350. The second printed circuit board (PCB) 300 may be electrically connected to the first flexible printed circuit board (FPCB) 350 by the anisotropic conductive film (ACF). In an exemplary embodiment, the second printed circuit board (PCB) 300 is formed of one substrate. However, exemplary embodiments are not limited thereto. For example, according to an exemplary embodiment, a plurality of second printed circuit boards (PCB) 300 may be provided, and the plurality of second printed circuit boards (PCB) 300 may be electrically connected to the display panel 100 through different first flexible printed circuit boards (FPCBs) 350.

Hereinafter, the second edge of the display panel 100 may indicate the other part of the peripheral area PA of the display panel 100 to which the second printed circuit board (PCB) 300 is electrically connected. The second edge of the display panel 100 may correspond to the second edge of the display area DA, and the second edge of the display area DA may indicate a lower edge of the screen when viewing the screen displaying the image. The second edge of the display panel 100 may face the first edge via the display area DA. Likewise, the second edge of the display area DA may face the first edge of the display area DA.

A plurality of second flexible printed circuit boards (FPCBs) 360 may be provided, and the plurality of second flexible printed circuit boards (FPCBs) 360 may be connected to the display panel 100 on a third edge and/or a fourth edge of the display panel 100. Each of the plurality of second flexible printed circuit boards (FPCBs) 360 may include a second driving circuit unit 361. The second driving circuit unit 361 may be a gate driver that applies a gate signal to the plurality of pixels PX, or a light emission driver that applies a light emission signal the plurality of pixels PX. For example, the second driving circuit unit 361 disposed on the third edge of the display panel 100 may be the gate driver, and the second driving circuit unit 361 disposed on the fourth edge of the display panel 100 may be the light emission driver. The second flexible printed circuit board (FPCB) 360 may be electrically connected to the display panel 100 by the anisotropic conductive film (ACF) in the peripheral area PA. The second flexible printed circuit board (FPCB) 360 may include the flexible circuit film, and the second driving circuit unit 361 may be mounted on the second flexible printed circuit board (FPCB) 360 as the chip on film (COF) type.

Hereinafter, the third edge of the display panel 100 indicates another part of the peripheral area PA of the display panel 100 to which the second flexible printed circuit board (FPCB) 360 is connected, and the fourth edge of the display panel 100 may indicate another part different from the third edge in the peripheral area PA of the display panel 100 to which another second flexible printed circuit board (FPCB) 360 is connected. The third edge of the display panel 100 may correspond to the third edge of the display area DA, and the third edge of the display area DA may indicate the left edge of the screen when viewing the screen on which the image is displayed. The fourth edge of the display panel 100 may correspond to the fourth edge of the display area DA, and the fourth edge of the display area DA may indicate the right edge of the screen when viewing the screen on which the image is displayed. The fourth edge of the display panel 100 may face the third edge of the display panel 100 via the display area DA. The third edge and the fourth edge of the display panel 100 may cross the first edge and the second edge of the display panel 100. For example, the first edge and the second edge may face each other, the third edge and the fourth edge may face each other, the first edge may connect first ends of the third edge to the fourth edge to each other, and the second edge may connect second ends of the third edge and the fourth edge to each other.

The third printed circuit board (PCB) 400 may include a signal controller 410 that controls the operation of the display panel 100, and a power supply unit 420 that provides a power source voltage used for the operation of the display panel 100. The signal controller 410 and the power supply unit 420 may be mounted on the third printed circuit board (PCB) 400 as the chip on board (COB) type. In FIGS. 1 and 2, the signal controller 410 and the power supply unit 420 are separated. However, exemplary embodiments are not limited thereto. For example, in an exemplary embodiment, the power supply unit 420 may be included in the signal controller 410.

The second connecting member 451 is disposed between the second printed circuit board (PCB) 300 and the third printed circuit board (PCB) 400, and electrically connects the second printed circuit board (PCB) 300 and the third printed circuit board (PCB) 400. The second connecting member 451 may be electrically connected to the second printed circuit board (PCB) 300 and the third printed circuit board (PCB) 400 by the anisotropic conductive film (ACF). The second connecting member 451 may include a flexible circuit film or a wiring cable.

The third connecting member 452 is disposed between the third printed circuit board (PCB) 400 and the first printed circuit board (PCB) 200, and electrically connects the third printed circuit board (PCB) 400 and the first printed circuit board (PCB) 200.

For convenience of explanation, FIG. 1 shows an exploded view of the display device before the third connecting member 452 is connected to the first printed circuit board (PCB) 200. As shown in FIG. 2, the first connecting member 250, the first flexible printed circuit board (FPCB) 350, and the second flexible printed circuit board (FPCB) 360 may be bent into the rear surface of the display panel 100, and on the rear surface of the display panel 100, the third printed circuit board (PCB) 400 and the first printed circuit board (PCB) 200 may be electrically connected by the third connecting member 452. The third connecting member 452 may be electrically connected to the third printed circuit board (PCB) 400 and the first printed circuit board (PCB) 200 by the anisotropic conductive film (ACF). The third connecting member 452 may include a flexible circuit film or a wiring cable.

The signal controller 410 may be electrically connected to the second flexible printed circuit board (FPCB) 360 through a control signal wiring CSL. The signal controller 410 may transmit a gate control signal (referring to CONT1 of FIG. 3) that controls the output of the gate signal of the second driving circuit unit 361, or a light emission control signal that controls the output of the light emission signal to the second driving circuit unit 361 through the control signal wiring CSL.

Hereinafter, an example in which the gate control signal CONT1 is transmitted through the control signal wiring CSL is described. The control signal wiring CSL may include wiring connected to the second flexible printed circuit board (FPCB) 360 disposed on the third edge of the display panel 100, and wiring connected to the second flexible printed circuit board (FPCB) 360 disposed on the fourth edge of the display panel 100. In FIGS. 1 and 2, a single control signal wiring CSL is connected to the second flexible printed circuit board (FPCB) 360 disposed at one of the third edge and the fourth edge of the display panel 100. However, exemplary embodiments are not limited thereto. For example, in an exemplary embodiment, the control signal wiring CSL may include a plurality of wirings. For example, the control signal wiring CSL may include a first wiring that transmits a scan start signal instructing an output start of the gate signal, at least one second wiring that transmits a clock signal of which an on voltage and an off voltage are repeated by a predetermined period, at least one third wiring that provides the driving voltage of the second driving circuit unit 361, etc.

The control signal wiring CSL connected to the signal controller 410 may be connected to the second flexible printed circuit board (FPCB) 360 through the third printed circuit board (PCB) 400, the third connecting member 452, the first printed circuit board (PCB) 200, the first connecting member 250, and the peripheral area PA of the display panel 100. The control signal wiring CSL may be connected to the first second flexible printed circuit board (FPCB) 360 disposed closest to the first edge among the plurality of second flexible printed circuit boards (FPCBs) 360 disposed on the third edge of the display panel 100. Also, the control signal wiring CSL may be connected to the first second flexible printed circuit board (FPCB) 360 disposed closest to the first edge among the plurality of second flexible printed circuit boards (FPCBs) 360 disposed on the fourth edge of the display panel 100. The signal controller 410 may apply the gate control signal CONT1 to the first edge of the display panel 100 through the first printed circuit board (PCB) 200 and the first connecting member 250 to be transmitted to the second driving circuit unit 361. For example, the signal controller 410 may apply the gate control signal CONT1 to the first edge of the display area DA through the first printed circuit board (PCB) 200 and the first connecting member 250.

The signal controller 410 may be electrically connected to the first driving circuit unit 351 through the third printed circuit board (PCB) 400, the second connecting member 451, the second printed circuit board (PCB) 300, and the first flexible printed circuit board (FPCB) 350, thereby transmitting the image data (referring to DAT of FIG. 4) and a data control signal (referring to CONT2 of FIG. 4) for controlling the first driving circuit unit 351 to the first driving circuit unit 351. In FIGS. 1 and 2, for convenience of illustration, wiring transmitting the image data DAT and the data control signal CONT2 are not shown. However, a data signal line DSL that transmits the image data DAT and the data control signal CONT2 is shown in FIG. 4, and will be described later.

The power supply unit 420 may transmit the power source voltage to the display panel 100 through the third printed circuit board (PCB) 400, the second connecting member 451, the second printed circuit board (PCB) 300, and the first flexible printed circuit board (FPCB) 350. Also, the power supply unit 420 may transmit the power source voltage to the display panel 100 through the third printed circuit board (PCB) 400, the third connecting member 452, the first printed circuit board (PCB) 200, and the first connecting member 250. In FIGS. 1 and 2, for convenience of illustration, the power source line that transmits the power source voltage is not shown. However, a first power source line PL1 and a second power source line PL2 that transmit the power source voltage is shown in FIGS. 3 and 4, and will be described later.

Referring to FIG. 3, the first connecting member 250 may include a first sub-connecting member 250-*a* closest to the third edge of the display panel 100 (relative to other sub-connecting members), and a second sub-connecting member 250-*b* disposed relatively further from the third edge of the display panel 100 compared to the first sub-connecting member 250-*a*.

The first sub-connecting member 250-*a* and the second sub-connecting member 250-*b* may each include a first line region LA1 and a second line region LA2. The control signal wiring CSL that transmits the gate control signal CONT1 may extend from the first printed circuit board (PCB) 200 to the display panel 100 through the first line region LA1 of the first sub-connecting member 250-*a*. The first line region LA1 of the first sub-connecting member 250-*a* may be disposed closer to the third edge of the display panel 100 than the second line region LA2 of the first sub-connecting member 250-*a*. As described above, the gate control signal CONT1 may be transmitted to the second driving circuit unit 361 of the second flexible printed circuit board (FPCB) 360 through the first sub-connecting member 250-*a*.

The second driving circuit unit 361 is connected to the plurality of gate lines GL through the second flexible printed circuit board (FPCB) 360, and may output a gate signal GS, which may be a combination of a gate-on voltage and a gate-off voltage, to the plurality of gate lines GL, according to the gate control signal CONT1. Since the gate control signal CONT1 is applied to the first second flexible printed circuit board (FPCB) 360 disposed closest to the first edge of the display panel 100, the gate signal GS may be sequentially output from the first edge of the display area DA to the second edge. Further, since the gate signal GS is sequentially output from the first edge of the display area DA to the second edge, a separate frame buffer for storing an image signal (referring to ImS of FIG. 5) or image data DAT converted from the image signal ImS is not required. This is described further below with reference to FIGS. 5 and 6 later.

The first power source line PL1 and the second power source line PL2 may be disposed on the second line region LA2 of the first sub-connecting member 250-*a*. Also, the first power source line PL1 and the second power source line PL2 may be disposed in each of the first line region LA1 and the second line region LA2 of the second sub-connecting member 250-*b*. The first power source line PL1 may be the wiring that transmits the first power source voltage to the plurality of pixels PX, and the second power source line PL2 may be wiring that transmits the second power source voltage to the plurality of pixels PX. For example, the power supply unit 420 may provide the first power source voltage and the second power source voltage to the first edge of the display area DA through the first printed circuit board (PCB) 200 and the first connecting member 250. The first power source voltage may be a high level voltage, and the second power source voltage may be a low level voltage. The first power source voltage and the second power source voltage may be the driving voltage for the light emission of the plurality of pixels PX. For example, the first power source voltage and the second power source voltage may include an ELVDD voltage of a high level and an ELVSS voltage of a low level.

FIG. 3 illustrates an example in which the first sub-connecting member 250-*a* and the second sub-connecting member 250-*b* adjacent thereto are disposed closest to the third edge of the display panel 100. Further, the first sub-connecting member 250-*a* is disposed closest to the fourth edge of the display panel 100, the second sub-connecting member 250-*b* is disposed adjacent thereto, and the control signal wiring CSL may extend from the first printed circuit board (PCB) 200 to the display panel 100 through the first line region LA1 of the first sub-connecting member 250-*a*.

Referring to FIG. 4, each of the plurality of first flexible printed circuit boards (FPCBs) 350 may include a region for the first driving circuit unit 351, a third line region LA3, and a fourth line region LA4. The third line region LA3 and the fourth line region LA4 may be regions in which the wiring may extend from the second printed circuit board (PCB) 300 to the display panel 100 without passing through the first driving circuit unit 351 on the first flexible printed circuit board (FPCB) 350.

The first driving circuit unit 351 is connected to the data signal line DSL. The data signal line DSL is connected to the signal controller 410, and the signal controller 410 may apply the image data DAT and the data control signal CONT2 to the first driving circuit unit 351 through the data signal line DSL. In FIG. 4, each first driving circuit unit 351 is connected to one data signal line DSL. However, exemplary embodiments are not limited thereto. For example, in an exemplary embodiment, each first driving circuit unit 351 may be connected to the signal controller 410 through a plurality of data signal lines DSL, and the image data DAT and the data control signal CONT2 may be transmitted to the first driving circuit unit 351 through the plurality of data signal lines DSL.

The first driving circuit unit 351 may convert the image data DAT into the data voltage Vdat according to the data control signal CONT2, and may apply the data voltage Vdat to the display area DA through the data line DL extending to the display area DA. For example, the first driving circuit unit 351 may apply the data voltage Vdat to the second edge of the display area DA. The data voltage Vdat may be input to the plurality of pixels PX through the data line DL.

The first power source line PL1 and the second power source line PL2 may be disposed in each of the third line region LA3 and the fourth line region LA4 of the first flexible printed circuit board (FPCB) 350. Accordingly, the first power source voltage and the second power source voltage may be provided to the display panel 100 through the plurality of first flexible printed circuit boards (FPCBs) 350. For example, the power supply unit 420 may provide the first power source voltage and the second power source voltage to the second edge of the display area DA through the second printed circuit board (PCB) 300 and the first flexible printed circuit board (FPCB) 350.

As shown in FIGS. 3 and 4, since the first power source voltage and the second power source voltage are applied to the first edge and the second edge of the display area DA through the plurality of first connecting members 250 and the plurality of first flexible printed circuit boards (FPCBs) 350, even if the display panel 100 has a large size, the distribution of the first power source voltage and the second power source voltage may be constantly maintained in the display area DA.

Next, a method capable of inputting the data to the display area DA without the need for an additional frame buffer that stores the image signal ImS is described with reference to FIGS. 5 and 6.

Referring to FIGS. 5 and 6, the image signal ImS is input to the signal controller 410 along with the input control signal from an external device. The image signal ImS includes luminance information of each of the plurality of pixels PX, and the luminance information includes a gray level of a predetermined number. The input control signal may include a vertical synchronization signal and a horizontal synchronization signal.

The signal controller 410 may receive the image signal ImS and the input control signal, may divide the image signal ImS by a frame unit according to the vertical synchronization signal, and may divide the image signal ImS by a pixel row (PXR1, PXR2, . . . , PXRn) unit according to the horizontal synchronization signal. The signal controller 410 may process the image signal ImS based on the image signal ImS and the input control signal to generate the image data DAT, the gate control signal CONT1, the data control signal CONT2, a light emission control signal, etc.

The image signal ImS may be input sequentially to the signal controller 410 from the signal corresponding to the first pixel row PXR1 of the first edge of the display area DA to the signal corresponding to the final pixel row PXRn of the second edge of the display area DA. The signal controller 410 processes the image signal ImS according to an input order to generate the image data DAT and transmits the image data DAT to the first driving circuit unit 351 (e.g., a data driver). The first driving circuit unit 351 outputs the data voltage Vdat corresponding to the input image data DAT to the data line DL connected to the plurality of pixels PX. For example, the first driving circuit unit 351 may sequentially output the data voltage Vdat from the data voltage Vdat corresponding to the first pixel row PXR1 to the data voltage Vdat corresponding to the final pixel row PXRn.

In this case, as the signal controller 410 transmits the gate control signal CONT1 to the second driving circuit unit 361 of the second flexible printed circuit board (FPCB) 360 disposed closest to the first edge of the display panel 100 through the first printed circuit board (PCB) 200 and the first connecting member 250, the gate signal of the gate-on voltage may be sequentially output from the first pixel row PXR1 to the final pixel row PXRn. Accordingly, the data voltage Vdat may be sequentially input to the plurality of pixels PX from the first pixel row PXR1 to the final pixel row PXRn.

As described above, since the signal controller 410 may generate and output the image data DAT by sequentially processing the image signal ImS, and the first driving circuit unit 351 may generate and output the data voltage Vdat in the order that the image data DAT is input, a frame buffer is not additionally required in exemplary embodiments of the present invention. This is because, in exemplary embodiments of the present invention, the signal controller 410 may transmit the gate control signal CONT1 to the second driving circuit unit 361 of the second flexible printed circuit board (FPCB) 360 disposed closest to the first edge of the display panel 100 through the first printed circuit board (PCB) 200 and the first connecting member 250.

Referring to a comparative example, if the signal controller 410 transmits the gate control signal CONT1 to the second driving circuit unit 361 of the second flexible printed circuit board (FPCB) 360 disposed closest to the second edge of the display panel 100 through the second printed circuit board (PCB) 300 and the first flexible printed circuit board (FPCB) 350, the gate signal of the gate-on voltage is sequentially output from the final pixel row PXRn to the first pixel row PXR1. In this case, since the data voltage Vdat is sequentially output from the final pixel row PXRn to the first pixel row PXR1, the signal controller 410 stores and processes the image signal ImS by one frame unit or stores and outputs the processed image data DAT by one frame unit, and thus, a frame buffer is required in the comparative example. Since the image signal ImS or the image data DAT is stored in the frame buffer, a data processing delay may be generated, and the manufacturing cost may be increased due to the addition of the frame buffer.

Still referring to a comparative example, if the signal controller 410 is configured to transmit the gate control signal CONT1 to the second driving circuit unit 361 of the second flexible printed circuit board (FPCB) 360 disposed closest to the first edge of the display panel 100 through the second printed circuit board (PCB) 300 and the first flexible printed circuit board (FPCB) 350, the control signal wiring CSL is disposed along the peripheral area PA from the second edge of the display panel 100 to the first edge in the comparative example. Since the control signal wiring CSL includes a plurality of wirings, a space for the plurality of wirings is further required in the peripheral area PA in the comparative example, and accordingly, the dead space (e.g., the bezel) of the display device may be increased in the comparative example.

In contrast to the above-described comparative example, according to exemplary embodiments of the present invention, since the control signal wiring CSL is connected to the first edge of the display panel 100 through the first printed circuit board (PCB) 200 and the first connecting member 250, the space needed for the control signal wiring CSL may be minimized or reduced in the peripheral area PA. As a result, the dead space (e.g., the bezel) of the display device may be minimized or reduced according to exemplary embodiments of the present invention.

If a plurality of parts is disposed on the part corresponding to the upper side of the screen, the upper side of the display device may become thicker on the outside. To prevent the display device from becoming thicker at the upper side of the display device, the plurality of parts may be disposed on the part corresponding to the lower side of the screen in exemplary embodiments of the present invention.

In exemplary embodiments, the circuit wiring is only entirely printed in the first printed circuit board (PCB) 200, and fewer parts are mounted.

In exemplary embodiments, the plurality of parts such as, for example, the memory 310, the temperature sensor 320, etc. is mounted on the second printed circuit board (PCB) 300. As a result, exemplary embodiments provide a free space to disperse heat generated by the first driving circuit unit 351 on the second printed circuit board (PCB) 300. For example, in exemplary embodiments, the first printed circuit board (PCB) 200 is manufactured with a relatively small size, and the second printed circuit board (PCB) 300 is manufactured with a relatively large size, since the plurality of parts is disposed on the second printed circuit board (PCB) 300. For example, in exemplary embodiments, the second printed circuit board (PCB) 300 is larger than the first printed circuit board (PCB) 200.

In exemplary embodiments, the second printed circuit board (PCB) 300 is disposed on the second edge (the lower edge of the screen) of the display panel 100. In the structure in which the second printed circuit board (PCB) 300 is disposed on the second edge (the lower edge of the screen) of the display panel 100, since the control signal wiring CSL is connected to the first edge of the display panel 100 through the first printed circuit board (PCB) 200 and the first connecting member 250, the dead space of the display device is not increased, the manufacturing cost is not increased, and the data processing delay due to the addition of the frame buffer is not generated.

Next, a display device according to an exemplary embodiment of the present invention will be described with reference to FIGS. 7 and 8. For convenience of explanation, a further description of elements and technical aspects previously described may be omitted, and the following description may primarily focus on the differences compared with FIGS. 1 to FIG. 6.

Figure 7:
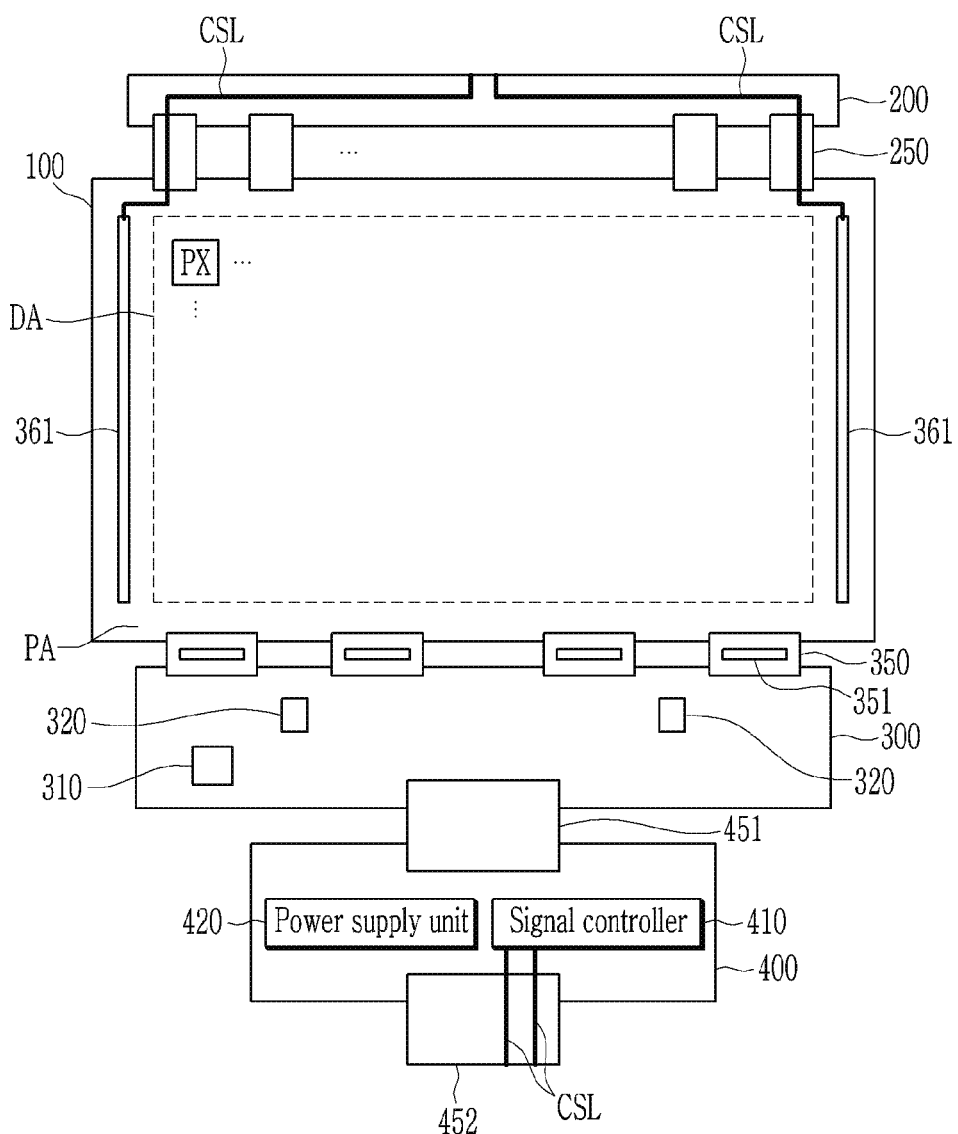
FIG. 7 is a top plan view of a front surface of a display device according to an exemplary embodiment of the present invention.

FIG. 7 is a top plan view of a front surface of a display device according to an exemplary embodiment of the present invention. FIG. 8 is a top plan view of a rear surface of a display device according to an exemplary embodiment of the present invention.

Figure 8:
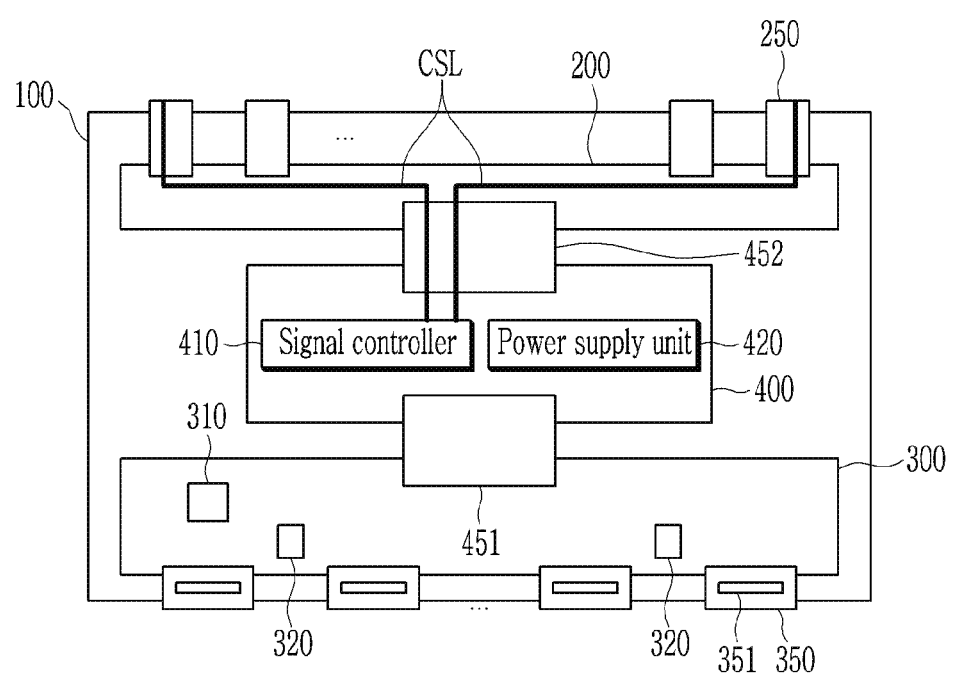
FIG. 8 is a top plan view of a rear surface of a display device according to an exemplary embodiment of the present invention.

Referring to FIGS. 7 and 8, the second driving circuit unit 361 may be disposed in the peripheral area PA of the third edge and/or the fourth edge of the display panel 100. The second driving circuit unit 361 may be disposed along the edge of the display area DA on the third edge and/or the fourth edge of the display panel 100. For example, in an exemplary embodiment, the display device does not include the second flexible printed circuit board (FPCB) 360, and the second driving circuit unit 361 extends along a majority of the third edge and/or the fourth edge of the display panel 100. In an exemplary embodiment, the second driving circuit unit 361 may extend along an entirety of the third edge and/or the fourth edge of the display panel 100. The signal controller 410 may be electrically connected to the second driving circuit unit 361 on the display panel 100 through the control signal wiring CSL. For example, the control signal wiring CSL connected to the signal controller 410 may be connected to the second driving circuit unit 361 through the third printed circuit board (PCB) 400, the third connecting member 452, the first printed circuit board (PCB) 200, the first connecting member 250, and the peripheral area PA of the display panel 100.

Except for the differences described above, since the characteristics of the exemplary embodiment described with reference to FIGS. 1 to 6 may be applied to the exemplary embodiment described with reference to FIGS. 7 and 8, a repeated description thereof is omitted.

Next, a display device according to an exemplary embodiment of the present invention will be described with reference to FIGS. 9 to 11. For convenience of explanation, a further description of elements and technical aspects previously described may be omitted, and the following description may primarily focus on the differences compared with FIGS. 1 to 6.

Figure 9:
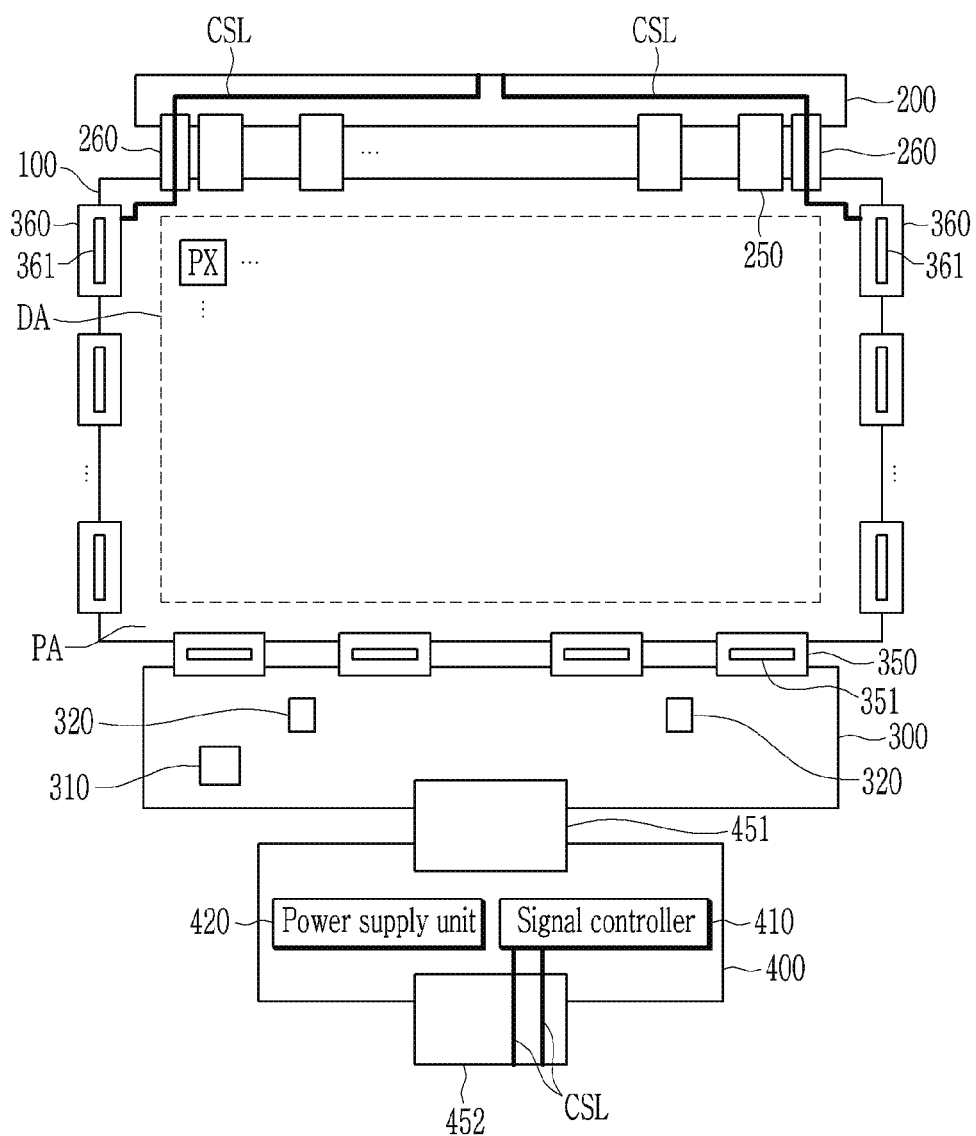
FIG. 9 is a top plan view of a front surface of a display device according to an exemplary embodiment of the present invention.

FIG. 9 is a top plan view of a front surface of a display device according to an exemplary embodiment of the present invention. FIG. 10 is a top plan view of a rear surface of a display device according to an exemplary embodiment of the present invention. FIG. 11 is an enlarged view of a first connecting member part of the display device in FIG. 9.

Figure 10:
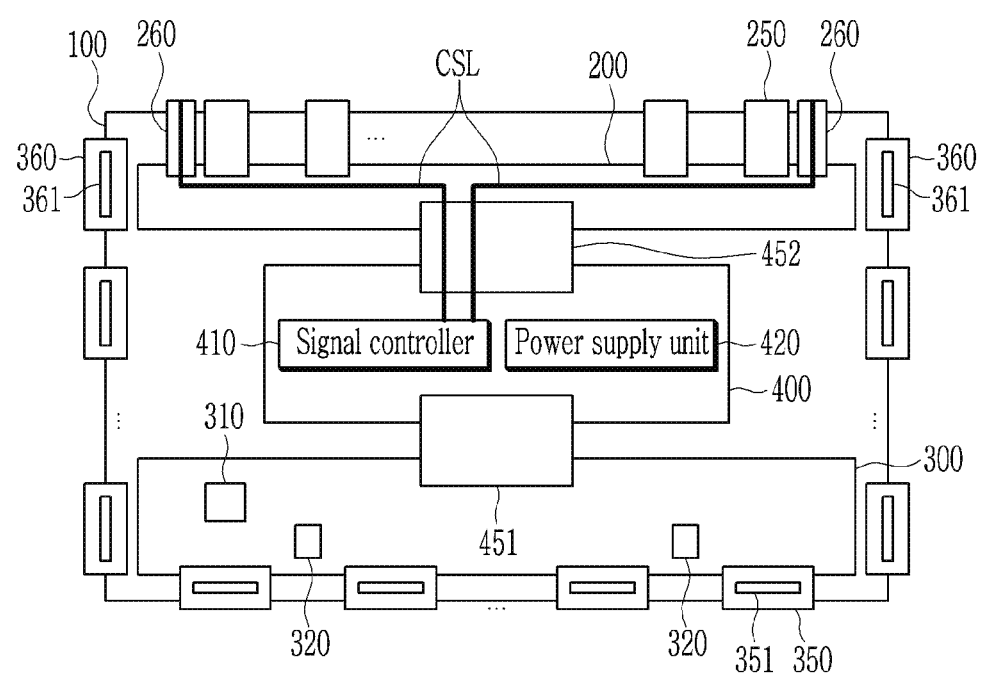
FIG. 10 is a top plan view of a rear surface of a display device according to an exemplary embodiment of the present invention.
Figure 11:
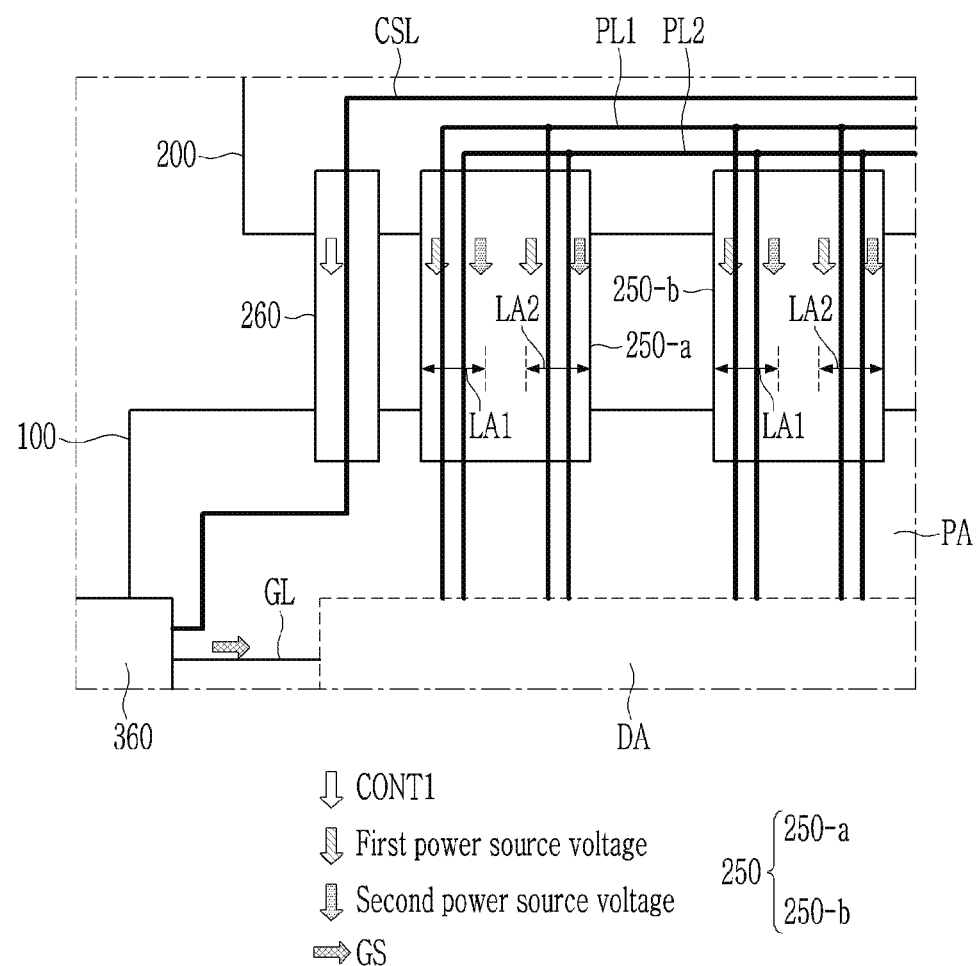
FIG. 11 is an enlarged view of a first connecting member part of the display device in FIG. 9.

Referring to FIGS. 9 to 11, the display device may further include a dummy connecting member 260. The dummy connecting member 260 is connected between the first printed circuit board (PCB) 200 and the display panel 100. The dummy connecting member 260 may be electrically connected to the first edge of the display panel 100 by the anisotropic conductive film (ACF). The dummy connecting member 260 may be electrically connected to the first printed circuit board (PCB) 200 by the anisotropic conductive film (ACF). The dummy connecting member 260 may include one part disposed closer to the third edge of the display panel 100 than the first connecting member 250, and another one part disposed closer to the fourth edge of the display panel 100 than the first connecting member 250. For example, in an exemplary embodiment, one dummy connecting member 260 is disposed closer to the second flexible printed circuit board (FPCB) 360 than the first connecting member 250.

The control signal wiring CSL is connected to the second flexible printed circuit board (FPCB) 360 through the dummy connecting member 260 without passing through the first connecting member 250. For example, the signal controller 410 may transmit the gate control signal CONT1 to the second driving circuit unit 361 through the first printed circuit board (PCB) 200 and the dummy connecting member 260. In this case, the first power source line PL1 and the second power source line PL2 may be disposed in each of the first line region LA1 and the second line region LA2 of the first sub-connecting member 250-*a* and the second sub-connecting member 250-*b*. For example, the control signal wiring CSL is not disposed in the first line region LA1 or the second line region LA2 of the first sub-connecting member 250-*a* since the control signal wiring CSL does not pass through the first connecting member 250 (see FIG. 11). The first power source line PL1 and the second power source line PL2 may be disposed in the first line region LA1 of the first sub-connecting member 250-*a*.

Except for the differences described above, since the characteristics of the exemplary embodiment described with reference to FIGS. 1 to 6 may be applied to the exemplary embodiment described with reference to FIGS. 9 to 11, a repeated description thereof is omitted.

Next, the display device according to an exemplary embodiment of the present invention will be described with reference to FIG. 12. For convenience of explanation, a further description of elements and technical aspects previously described may be omitted, and the following description may primarily focus on the differences compared with FIGS. 1 to 6.

Figure 12:
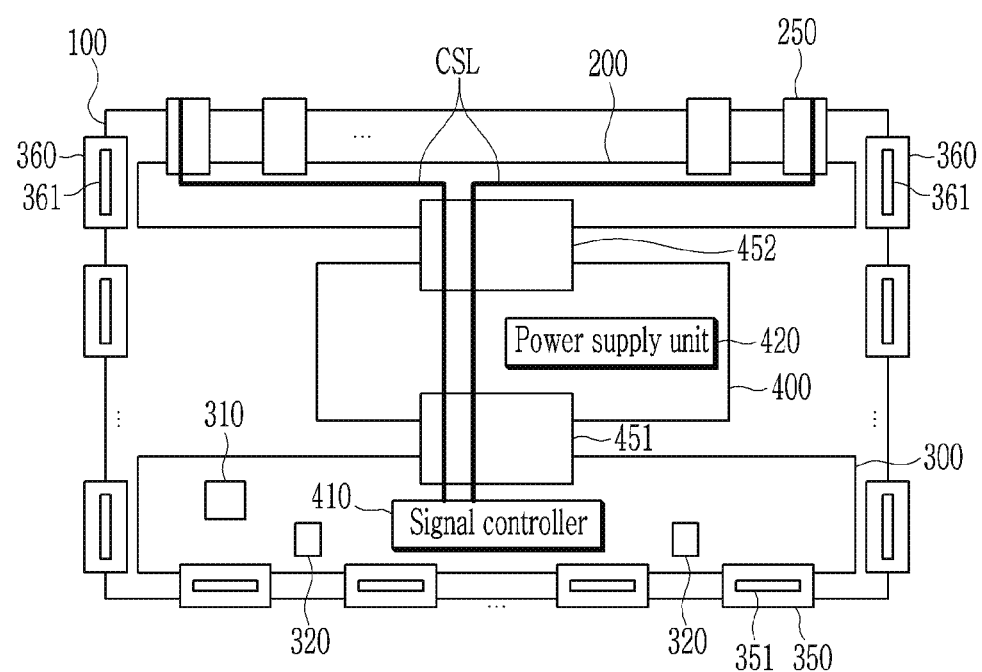
FIG. 12 is a top plan view of a rear surface of a display device according to an exemplary embodiment of the present invention.

FIG. 12 is a top plan view of a rear surface of a display device according to an exemplary embodiment of the present invention.

Referring to FIG. 12, in an exemplary embodiment, the signal controller 410 is not disposed in the third printed circuit board (PCB) 400, but rather, is disposed in the second printed circuit board (PCB) 300. Accordingly, the control signal wiring CSL may be connected to the second flexible printed circuit board (FPCB) 360 through the second printed circuit board (PCB) 300, the second connecting member 451, the third printed circuit board (PCB) 400, the third connecting member 452, the first printed circuit board (PCB) 200, the first connecting member 250, and the peripheral area PA of the display panel 100.

Except for the differences described above, since the characteristics of the exemplary embodiment described with reference to FIGS. 1 to 6 may be applied to the exemplary embodiment described with reference to FIG. 12, a repeated description thereof is omitted.

Next, a display device according to an exemplary embodiment of the present invention will be described with reference to FIG. 13. For convenience of explanation, a further description of elements and technical aspects previously described may be omitted, and the following description may primarily focus on the differences compared with FIGS. 1 to 6.

Figure 13:
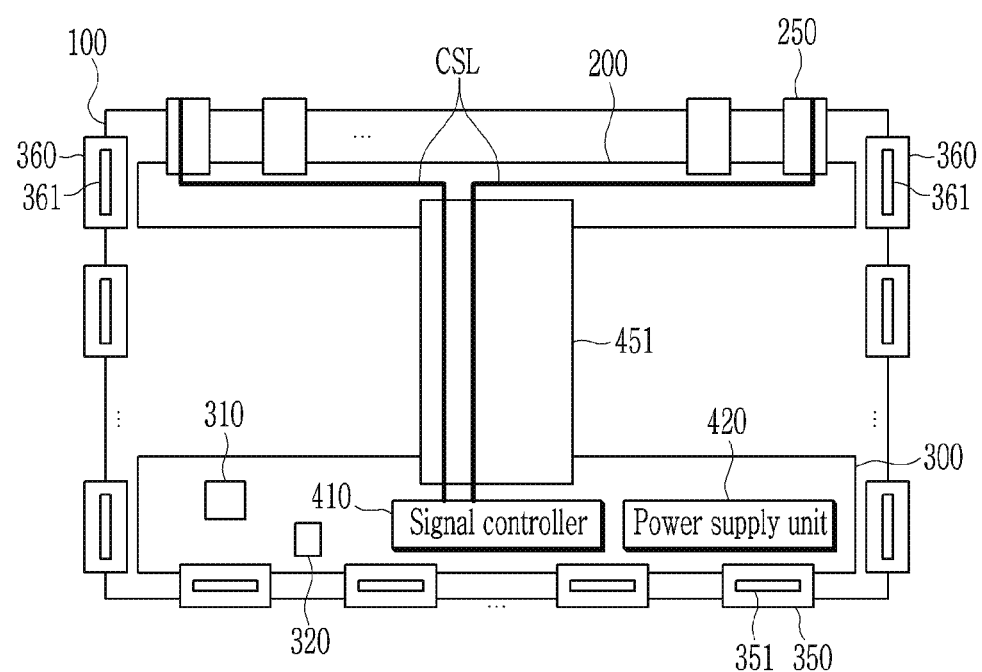
FIG. 13 is a top plan view of a rear surface of a display device according to an exemplary embodiment of the present invention.

FIG. 13 is a top plan view of a rear surface of a display device according to an exemplary embodiment of the present invention.

Referring to FIG. 13, in an exemplary embodiment, the display device includes the display panel 100, the first printed circuit board (PCB) 200, the first connecting member 250, the second printed circuit board (PCB) 300, the first flexible printed circuit board (FPCB) 350, the second flexible printed circuit board (FPCB) 360, and the second connecting member 451, and does not include the third printed circuit board (PCB) 400 and the third connecting member 452.

The second connecting member 451 may be disposed between the first printed circuit board (PCB) 200 and the second printed circuit board (PCB) 300, and may electrically connect the first printed circuit board (PCB) 200 and the second printed circuit board (PCB) 300. The second connecting member 451 may be electrically connected to the first printed circuit board (PCB) 200 and the second printed circuit board (PCB) 300 by the anisotropic conductive film (ACF).

The signal controller 410 and the power supply unit 420 may be disposed on the second printed circuit board (PCB) 300. Accordingly, the control signal wiring CSL may be connected to the second flexible printed circuit board (FPCB) 360 though the second printed circuit board (PCB) 300, the second connecting member 451, the first printed circuit board (PCB) 200, the first connecting member 250, and the peripheral area PA of the display panel 100.

Except for the differences described above, since the characteristics of the exemplary embodiment described with reference to FIGS. 1 to 6 may be applied to the exemplary embodiment described with reference to FIG. 13, a repeated description thereof is omitted.

As is traditional in the field of the present invention, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
a display panel comprising a plurality of pixels;
a connecting member connected to the display panel on a first edge of the display panel;
a first printed circuit board (PCB) electrically connected to the display panel through the connecting member;
a first flexible printed circuit board (FPCB) connected to the display panel on a second edge of the display panel, wherein the first FPCB comprises a first driving circuit that applies a data voltage to the plurality of pixels;
a second PCB electrically connected to the display panel through the first FPCB;
a second driving circuit disposed on a third edge of the display panel, wherein the second driving circuit applies a gate signal to the plurality of pixels; and
a third PCB electrically connected to the first PCB and the second PCB, wherein the third PCB comprises a signal controller that controls the first driving circuit and the second driving circuit,
wherein the signal controller applies a gate control signal to the first edge of the display panel, which opposes the second edge of the display panel, through the first PCB and the connecting member without passing through the second PCB and the first FPCB connected to the display panel on the second edge of the display panel,
wherein the gate control signal is provided to the second driving circuit through the connecting member to control an output of the gate signal.

2. The display device of claim 1, wherein
a display area comprising the plurality of pixels is disposed between the second edge and the first edge.

3. The display device of claim 1, wherein
the signal controller transmits a data control signal that controls the first driving circuit to the first driving circuit through the second PCB.

4. The display device of claim 1, wherein
the third PCB further comprises a power supply that provides a power source voltage to the plurality of pixels, and
the power supply provides the power source voltage to the plurality of pixels through the first PCB and the connecting member.

5. The display device of claim 4, wherein the connecting member comprises:
a first sub-connecting member; and
a second sub-connecting member,
wherein the second sub-connecting member is disposed further from the third edge of the display panel than the first sub-connecting member,
wherein the gate control signal is transmitted to the second driving circuit through the first sub-connecting member, and the power source voltage is transmitted to the plurality of pixels through the second sub-connecting member.

6. The display device of claim 5, wherein the first sub-connecting member comprises:
a first line region in which a control signal wiring that transmits the gate control signal is disposed; and
a second line region in which a power source line that transmits the power source voltage is disposed,
wherein the first line region is disposed closer to the third edge of the display panel than the second line region.

7. The display device of claim 1, further comprising:
a second FPCB connected to the display panel on the third edge of the display panel and comprising the second driving circuit.

8. The display device of claim 1, wherein
the display panel comprises a display area in which the plurality of pixels is disposed and a peripheral area surrounding the display area, and
the second driving circuit is disposed in the peripheral area of the display panel.

9. A display device, comprising:
a display area comprising a plurality of pixels;
a power supply that applies a power source voltage to a first edge of the display area;
a data driver that applies a data voltage to a second edge of the display area, wherein the second edge faces the first edge and the display area is disposed between the second edge and the first edge;
a first flexible printed circuit board (FPCB) connecting the power supply to the second edge of the display area;
a gate driver disposed on a third edge of the display area, wherein the gate driver applies a gate signal to the display area; and
a signal controller that applies a gate control signal that controls the gate driver to the first edge of the display area, wherein the gate control signal is provided to the gate driver through a first connecting member connected to the first edge of the display area or a dummy connecting member connected to the first edge of the display area to control an output of the gate signal,
wherein the power supply transmits the power source voltage to the plurality of pixels through the first connecting member connected to the first edge of the display area without passing through the first FPCB connected to the second edge of the display area, which opposes the first edge,
wherein, when viewing a screen on which an image is displayed in the display area, the first edge is an upper edge of the screen, the second edge is a lower edge of the screen, and the third edge is a right edge of the screen or a left edge of the screen.

10. The display device of claim 9, wherein
the signal controller transmits the gate control signal to the gate driver through the dummy connecting member, and
the first connecting member is disposed adjacent to the dummy connecting member,
wherein the dummy connecting member is disposed closer to the third edge of the display area than the first connecting member.

11. The display device of claim 9, wherein
the signal controller transmits the gate control signal to the gate driver through a first sub-connecting member of the first connecting member, and
the power supply transmits the power source voltage to the plurality of pixels through the first sub-connecting member and a second sub-connecting member of the first connecting member disposed adjacent to the first sub-connecting member,
wherein the first sub-connecting member is disposed closer to the third edge of the display area than the second sub-connecting member.

12. The display device of claim 9, further comprising:
a second FPCB disposed in a peripheral area adjacent to the third edge of the display area,
wherein the gate driver is mounted on the second FPCB.

13. The display device of claim 9, wherein
the gate driver is disposed along the display area in a peripheral area adjacent to the third edge of the display area.

14. The display device of claim 9, wherein
the first FPCB is disposed in a peripheral area adjacent to the second edge of the display area, and
the data driver is mounted on the first FPCB.

15. A display device, comprising:
a display panel comprising a plurality of pixels;
a second driving circuit that applies a gate signal to the plurality of pixels;
a first connecting member connected to the display panel on a first edge of the display panel, wherein the first connecting member comprises a control signal wiring connected to the second driving circuit; and
a flexible printed circuit board (FPCB) connected to the display panel on a second edge of the display panel,
wherein the second edge faces the first edge, and the FPCB comprises a first driving circuit that applies a data voltage to the plurality of pixels;
a first printed circuit board (PCB) electrically connected to the display panel through the first connecting member;
a second PCB electrically connected to the display panel through the FPCB; and
a signal controller disposed on the second PCB, wherein the signal controller controls the first and second driving circuits,
wherein the control signal wiring is connected to the signal controller through the first connecting member to control an output of the gate signal, and
wherein the signal controller is connected to the second driving circuit via the control signal wiring through the first PCB and the first connecting member, which is connected to the display panel on the first edge of the display panel, without passing through the FPCB connected to the display panel on the second edge of the display panel, which opposes the first edge.

16. The display device of claim 15, wherein the first connecting member further comprises:
a power source line that transmits a power source voltage for emission of the plurality of pixels.

17. The display device of claim 15, further comprising:
a third PCB electrically connected to the first PCB and the second PCB, wherein the third PCB comprises a power supply that provides a power source voltage to the plurality of pixels,
wherein the control signal wiring is connected to the signal controller through the first connecting member, the first PCB, and the third PCB.

18. The display device of claim 15, further comprising:
a second connecting member electrically connecting the first PCB and the second PCB,
wherein the control signal wiring is connected to the signal controller through the first connecting member, the first PCB, and the second connecting member.

* * * * *